United States Patent
Nishi et al.

(10) Patent No.: US 7,568,959 B2
(45) Date of Patent: Aug. 4, 2009

(54) CONNECTING LEAD WIRE FOR A SOLAR BATTERY, METHOD FOR FABRICATING SAME, AND SOLAR BATTERY USING THE CONNECTING LEAD WIRE

(75) Inventors: Hajime Nishi, Hitachi (JP); Takayuki Tsuji, Hitachi (JP); Yuju Endo, Hitachi (JP); Hiroyuki Akutsu, Hitachi (JP)

(73) Assignees: Hitachi Cable, Ltd., Tokyo (JP); Hitachi Cable Fine Tech, Ltd., Ibaraki (JP)

( * ) Notice: Subject to any disclaimer, the term of this patent is extended or adjusted under 35 U.S.C. 154(b) by 0 days.

(21) Appl. No.: 11/898,469

(22) Filed: Sep. 12, 2007

(65) Prior Publication Data

US 2008/0076307 A1 Mar. 27, 2008

(30) Foreign Application Priority Data

Sep. 13, 2006 (JP) ............................. 2006-248285
Aug. 3, 2007 (JP) ............................. 2007-202429

(51) Int. Cl.
*H01R 13/502* (2006.01)
(52) U.S. Cl. ..................................................... 439/886
(58) Field of Classification Search .......... 439/886–887
See application file for complete search history.

(56) References Cited

U.S. PATENT DOCUMENTS 7,148,426 B2 12/2006 Aoyama et al.

2003/0024733 A1 2/2003 Aoyama et al.

FOREIGN PATENT DOCUMENTS

| JP | 11-021660 | 1/1999 |
| JP | 2002-263880 | 9/2002 |
| JP | 2005-243935 | 9/2005 |
| JP | 2005-243972 | 9/2005 |
| JP | 2006-049666 | 2/2006 |
| JP | 2006-054355 | 2/2006 |
| JP | 2006-140039 | 6/2006 |
| JP | 2006190574 | * 7/2006 |
| WO | WO 2005/114751 | 12/2005 |

* cited by examiner

*Primary Examiner*—Truc T Nguyen
(74) *Attorney, Agent, or Firm*—McGinn IP Law Group, PLLC

(57) ABSTRACT

A metallic material is rolled to provide a conductor 3 having a rectangular cross section. A surface of the rectangular conductor 3 is plated with a plating layer 14. A thickness of the plating layer 14 at a surface facing to the Si cell is not more than 5 μm to provide a connecting lead wire 12 for a solar battery. The connecting lead wire 12 for a solar battery has 0.2% proof stress of not more than 60 MPa. The connecting lead wire 12 for a solar battery is connected to a predetermined contact region of a Si cell 1 of a solar battery at a high temperature.

20 Claims, 3 Drawing Sheets

1 Si CELL
2 SOLDER PLATED RECTANGULAR WIRE
4 SOLDER PLATING

US 7,568,959 B2

CONNECTING LEAD WIRE FOR A SOLAR BATTERY, METHOD FOR FABRICATING SAME, AND SOLAR BATTERY USING THE CONNECTING LEAD WIRE

The present application is based on Japanese Patent Application No. 2006-248285 filed on Sep. 13, 2006 and Japanese Patent Application No. 2007-202429 filed on Aug. 3, 2007, the entire contents of which are incorporated herein by reference.

BACKGROUND OF THE INVENTION

1. Field of the Invention

The present invention relates to a connecting lead wire for a solar battery, a method for fabricating the same, and a solar battery using the connecting lead wire, in more particularly, to a connecting lead wire to be connected to a predetermined contact region of a Si cell in a solar battery, a method for fabricating the same, and a solar battery using the connecting lead wire.

2. Related Art

In a solar battery that is the mainstream in recent days, a Si cell comprising a polycrystal or single crystal Si crystal wafer is used.

FIG. 2 is a perspective view showing a state where a connecting lead wire for a solar battery is connected to a Si cell.

As shown in FIG. 2, a solder plated rectangular wire 2 (connecting lead wire for a solar battery) is joined with a predetermined region of a Si cell 1 by a solder, through which an electric power generated in the Si cell 1 is transmitted.

FIG. 3 is a lateral cross sectional view of a conventional and typical connecting lead wire for a solar battery.

As for the solder plated rectangular wire 2, there is a rectangular conductor in which a pure Cu such as tough pitch Cu or oxygen-free Cu is used as a conductor 3 and a solder plating 4 comprising Sn—Pb eutectic solder is used as shown in FIG. 3. Japanese Patent Laid-Open No. 11-21660 discloses this type of the rectangular conductor wire for a solar a solar battery.

In addition, it has been studied to change from a Pb-based solder to a Pb-free solder with considering the affect on the environment. Japanese Patent Laid-Open No. 2002-263880 discloses a typical Pb-free solder and a connecting lead wire using the same. Similarly, the conventional solar batteries and the connecting lead wires using a Pb-free solder are disclosed by Japanese Patent Laid-Open Nos. 2005-243972, 2006-49666, 2006-140039, 2006-54355, and 2005-243935.

Among members composing the solar battery, the Si crystal wafer holds most of a material cost of the solar battery. Therefore, it has been studied to reduce a plate thickness of the Si crystal wafer. However, when the plate thickness of the Si crystal wafer is reduced, there are disadvantages in that the Si crystal wafer is warped or damaged due to the temperature change in a heating process for bonding the connecting lead wire to the Si cell or in the use of the solar battery.

FIGS. 4A and 4B are explanatory diagrams showing connecting states of the Si cell and the connecting lead wire for a solar battery, in which FIG. 4A shows a state before solder bonding, and FIG. 4B shows a state where a warping occurs after solder bonding. For example, as shown in FIG. 4A, warping does not occur in the Si cell 1 and solder plated rectangular wire 2 and both of them are straight, before the solder bonding. However, as shown in FIG. 4B, the warping occurs in the Si cell 1 after the solder bonding.

So as to solve this problem, a demand for a material with a low thermal expansion as a material of the connecting lead wire is elevated.

FIG. 5 is a lateral cross-sectional view of a conventional connecting lead wire for a solar battery using CIC (Cu-invar-Cu).

When a cladding material CIC, in which Cu 3' and Fe-36 mass % Ni (generally called as "invar" (registered trademark)) 5 are laminated as cladding layers in order of Cu-invar-Cu as shown in FIG. 5, is used as the rectangular conductor, since the invar has a low thermal expansion as shown in TABLE 1 describing material properties of Cu-invar-Cu, Cu, invar, and Si, it is possible to realize a thermal expansion matching with Si. However, an electric conductivity of invar is lower than that of Cu (namely, a volume resistivity of invar is higher than that of Cu), so that a generating efficiency of the solar battery is deteriorated.

TABLE 1

| material | Cladding material Cu-invar-Cu Plate thickness ratio 2:1:2 | Cu | invar | Si |
|---|---|---|---|---|
| Thermal expansion Coefficient ($\times 10^{-6}/°$ C.) | 13.1 | 17.0 | 1.8 | 3.5 |
| Young's Modulus (MPa) | 125 | 120 | 145 | 170 |
| Volume resistivity ($\mu\Omega \cdot$ mm) | 21.0 | 16.9 | 810 | $2.3 \times 10^9$ |

As a technique for realizing both of a high electric conductivity and a warping suppression, it may be possible to reduce a "cell warping force" generated by a thermal shrinkage of the conductor after the solder bonding, by reducing 0.2% proof stress value of the conductor with a high electric conductivity. According to this technique, the thermal expansion matching with Si can be realized. However, the 0.2% proof stress values of the conductor coated with the solder 4 is increased compared with that of the conductor before solder plating, so that it is difficult to realize a further reduction in the thickness of the cell.

SUMMARY OF THE INVENTION

Accordingly, it is an object of the invention to provide a connecting lead wire for a solar battery, a method for fabricating the same, and a solar battery using the connecting lead wire, in which a warping of a Si cell is little nevertheless the thermal shrinkage after a connection to the Si cell, and a high electric conductivity can be obtained.

According to a first feature of the invention, a connecting lead wire for a solar battery, to be connected to a predetermined contact region of a Si cell of the solar battery at a high temperature, the connecting lead wire comprises:

a conductor having a rectangular cross section; and a plating layer provided on the rectangular conductor;

wherein a 0.2% proof stress of the connecting lead wire is not more than 60 MPa, and a thickness of the plating layer at a surface facing to the Si cell is not more than 5 μm.

According to a second feature of the invention, in the connecting lead wire for a solar battery, a material of the rectangular conductor may comprise a metal selected from a group consisting of Cu, Al, Ag, and Au.

According to a third feature of the invention, in the connecting lead wire for a solar battery, the material of the rectangular conductor may comprise a tough pitch copper, a low oxygen copper, an oxygen-free copper, a phosphorous deoxidized copper, or a high purity copper with a purity of not less than 99.9999%.

According to a fourth feature of the invention, in the connecting lead wire for a solar battery, a volume resistivity of the rectangular conductor may be not more than 50 μΩ·mm.

According to a fifth feature of the invention, in the connecting lead wire for a solar battery, the plating layer may comprise a metallic material containing at least one element selected from a group consisting of Ni, Ag, Sn, Zn, Cr, Au, Pd, Ru, and Pt.

According to a sixth feature of the invention, in the connecting lead wire for a solar battery, the metallic material further contains an accessory element of not more than 1000 ppm as a third component.

According to a seventh feature of the invention, in the connecting lead wire for a solar battery, the third component may comprise Co or P.

According to an eighth feature of the invention, a method for fabricating a connecting lead wire for a solar battery, to be connected to a predetermined contact region of a Si cell of the solar battery at a high temperature, the method comprises the steps of:

forming a conductor having a rectangular cross section from a metallic material;

conducting a heat treatment on the rectangular conductor;

providing a plating layer on the rectangular conductor to have a thickness of not more than 5 μm at a surface facing to the Si cell; and adjusting a 0.2% proof stress of the connecting lead wire to be not more than 60 MPa.

According to a ninth feature of the invention, in the method for fabricating a connecting lead wire for a solar battery, the metallic material may have a volume resistivity of not more than 50 μΩ·mm.

According to a tenth feature of the invention, in the method for fabricating a connecting lead wire for a solar battery, the metallic material may be rolled to provide the rectangular conductor.

According to an eleventh feature of the invention, in the method for fabricating a connecting lead wire for a solar battery, the slit processing may be conducted on the metallic material to provide the rectangular conductor.

According to a twelfth feature of the invention, in the method for fabricating a connecting lead wire for a solar battery, the heat treatment is continuous electric heating, heat treatment using a continuous furnace, or heat treatment using a batch type heating equipment.

According to a thirteenth feature of the invention, a solar battery comprises:

a Si cell; and a connecting lead wire connected to a predetermined contact region of the Si cell at a high temperature, the connecting lead wire comprising:

a conductor having a rectangular cross section; and a plating layer provided on the rectangular conductor;

wherein a 0.2% proof stress of the connecting lead wire is not more than 60 MPa, and a thickness of the plating layer at a surface facing to the Si cell is not more than 5 μm.

According to a fourteenth feature of the invention, a method for fabricating a solar battery, comprises the steps of:

preparing a Si cell having a contact region;

preparing a connecting lead wire comprising a conductor having a rectangular cross section and a plating layer provided on the rectangular conductor, a 0.2% proof stress of the connecting lead wire being not more than 60 MPa, and a thickness of the plating layer at a surface facing to the Si cell being not more than 5 μm;

applying a conductive adhesive or a solder on a part of the connecting lead wire to be connected to the predetermined contact region of the Si cell;

contacting the contact region of the Si cell with the part of the connecting lead wire on which the conductive adhesive or the solder is applied;

melting the conductive adhesive or the solder by heating at a high temperature; and solidifying the conductive adhesive or the solder to adhere and connect the contact region of the Si cell and the connecting lead wire with each other.

According to the present invention, the warping of the Si cell is small nevertheless the thermal shrinkage after the connection to the Si cell and the high electric conductivity can be obtained. Further, it is possible to measure 0.2% proof stress value easily.

BRIEF DESCRIPTION OF THE DRAWINGS

Next, the present invention will be explained in more detail in conjunction with appended drawings, wherein:

FIGS. 4A and 4B are explanatory diagrams showing connecting states of the Si cell and the connecting lead wire for a solar battery, wherein FIG. 4A shows a state before solder bonding, and FIG. 4B shows a state where a warping occurs after solder bonding;

DETAILED DESCRIPTION OF PREFERRED EMBODIMENT

Next, a preferred embodiment according to the present invention will be explained in more detail in conjunction with the appended drawings.

In general, when different kind of metals having different thermal expansion coefficients are connected with each other at a high temperature, a cell warping force is generated as a product of a temperature variation, a difference in the thermal expansion coefficients and a difference in the Young's modulus. However, in the case of the solar battery where rigidities of two connected materials (Si cell and connecting lead wire for a solar battery) are remarkably different from each other and a bonding temperature is not less than 200° C., the conductor (connecting lead wire for a solar battery) having a cross section smaller than that of the other one yields. Therefore, the force generated by the difference in the thermal expansion coefficients and the difference in the Young's modulus does not directly correspond to the warping generating force.

If the yield strength of the conductor is low, the conductor plastically deforms with a small (weak) force, thereby generating no more deformation resistance. Therefore, a connecting lead wire for a solar battery using a conductor having a low 0.2% proof stress, which is an index of plastic deformation, has an effect of reducing the warping quantity after bonding to the Si cell.

Figure 1:
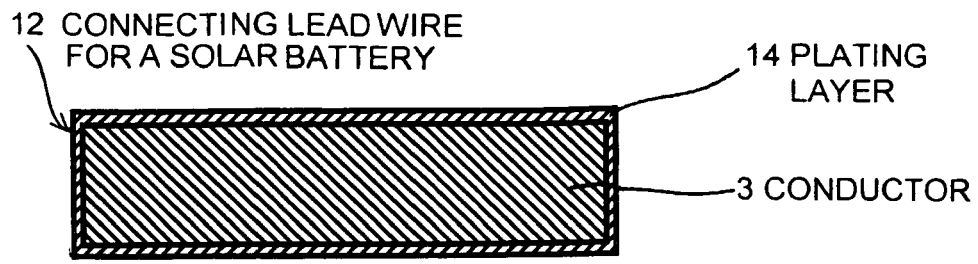
FIG. 1 is a lateral cross-sectional view of a connecting lead wire for a solar battery in a preferred embodiment according to the present invention.

FIG. 1 is a lateral cross-sectional view of a connecting lead wire for a solar battery in a preferred embodiment according to the present invention.

As shown in FIG. 1, a connecting lead wire 12 for a solar battery in the preferred embodiment comprises a conductor 3 and a plating layer (thin plating) 14 on a surface of the conductor 3, and 0.2% proof stress value is not more than 60 MPa.

The conductor 3 comprises a material having a relatively small volume resistivity, in concrete, the volume resistivity of not more than 50 μΩ·mm. It is preferable that a lateral cross section of the conductor 3 is rectangular to facilitate a connection to the Si cell. In addition, a thickness of the plating layer 14 is not more than 5 μm.

As for a material of the conductor 3, Au, Ag, and Al may be used other than Cu as shown in TABLE 2. The 0.2% proof stress may be further reduced by the material selection. Among these conductor materials, Ag has the lowest volume resistivity, so that it is possible to realize a maximum generating efficiency by using an Ag conductor. In addition, it is desirable to select Cu as the conductor material when a priority is given to the reduction in cost, and to select Al as the conductor material when the reduction in weight is desired. The 0.2% proof stress value shown in TABLE 2 is not inherent to the material and variable by conducting a heat treatment at a temperature exceeding its apparent initial softening. Therefore, the respective 0.2% proof stress values of Cu, Ag, Au and Al are only examples.

TABLE 2

| Material | Cu | Ag | Au | Al |
|---|---|---|---|---|
| Thermal expansion Coefficient (×10$^{-6}$/° C.) | 17.0 | 19.1 | 29.0 | 23.5 |
| 0.2% Proof stress (MPa) | 40 | 55 | 30 | 20 |
| Volume resistivity (μΩ·mm) | 16.9 | 16.3 | 22.0 | 26.7 |

As for the material of Cu, tough pitch copper, low oxygen copper, oxygen-free copper, phosphorous deoxidized copper, and high purity copper (purity of not less than 99.9999%) may be used. In order to minimize the 0.2% proof stress, it is advantageous to use a copper with high purity, for example, the high purity copper having a purity of not less than 99.9999%.

On the other hand, in order to realize the reduction in cost, it is preferable to select the tough pitch copper or the phosphorous deoxidized copper, while the tough pitch copper and the phosphorous deoxidized copper include the impurity and the 0.2% proof stress is large.

A metal to be used for the plating layer 14 is a metallic material comprising at least one element selected from a group consisting of Ni, Ag, Sn, Zn, Cr, Au, Pd, Ru, and Pt, that may further include an accessory element of not more than 1000 ppm as the third component. As for the metal to be used for the plating layer 14, Ni is particularly excellent since the cost is low and the conductor metal diffusion can be suppressed when the heat-treatment is conducted on the plated wire. In addition, as for the accessory element that is the third component, Co, P or the like may be used.

An example of a method for fabricating a connecting lead wire 12 for a solar battery in this preferred embodiment will be explained below.

Firstly, a metal material having the volume resistivity of not more than 50 μΩ·mm composing the conductor 3 is rolled to have a rectangular cross section, to provide a rectangular conductor. A batch type heat treatment is conducted on the rectangular conductor, so as to reduce the 0.2% proof stress of the rectangular conductor, such that the 0.2% proof stress is adjusted to be a predetermined value (the desired 0.2% proof stress value is 60 MPa).

The plating layer 14 having a thickness of not more than 5 μm is provided at an outer periphery of the rectangular conductor after the heat treatment, to provide a connecting lead wire 12 for a solar battery having the 0.2% proof stress value of not more than 60 MPa.

As for a method for processing the conductor 3 to have the rectangular cross section, either of rolling and slit processing can be applied. According to the method of rolling a round wire into a rectangular wire, it is possible to fabricate uniform and lengthy rectangular conductors. According to the slit processing, there is an advantage in that various materials having different widths can be used.

As for a heat treatment for reducing the 0.2% proof stress of the conductor 3, either of electrical heating process, heat treatment using a continuous furnace, and heat treatment using a batch type equipment can be applied. When the heat treatment is continuously conducted on a lengthy conductor, the electrical heating process or the heat treatment using a continuous furnace is preferable. When a stable heat treatment is required, the batch type heat treatment is preferable. Further, for preventing the conductor 3 from oxidation in the heat treatment, the heat treatment may be conducted by using a furnace with a hydrogen reduction atmosphere or a furnace with an atmosphere of inert gas such as nitrogen. Still further, the heat treatment is conducted at a temperature exceeding the apparent initial softening of the conductor 3, and the heat treatment condition is adjusted such that the 0.2% proof stress is reduced to a predetermined value. In addition, the heat treatment may be conducted twice or more, for example, after providing the plating layer at the outer periphery of the rectangular conductor, or before and after the plating. In these cases, it is possible to further reduce the 0.2% proof stress compared with the case that the heat treatment is conducted only before the plating.

As for a plating method of the plating layer 14, batch type processing such as galvanic electroplating, electroless plating can be applied. By conducting the plating with using the batch type processing, it is possible to prevent work hardening due to a tension generated by continuous plating, thereby suppressing the increase in the 0.2% proof stress of the conductor.

The connecting lead wire 12 for a solar battery in this preferred embodiment is connected to a predetermined contact region of the Si cell of the solar battery. In concrete, a conductive adhesive or a solder is applied prior to the connection on a part of the connecting lead wire 12 for a solar battery to be connected to the contact region, and the contact region of the solar battery and the connection lead wire 12 for a solar battery on which the conductive adhesive or solder is applied are put into contact with each other. Thereafter, the conductive adhesive or solder is melt by heating at a high temperature, and the adhesive or solder is solidified so that the contact region of the solar battery and the connecting lead wire 12 for a solar battery are adhered and connected with each other, to provide the solar battery.

As for the conductive adhesive, it is preferable to have a thermal conductivity equal to or more than that of the solder as well as a volume resistivity and a melting temperature equal to or less than those of the solder. In addition, the conductive adhesive or solder may be applied to a predetermined contact region of the Si cell prior to the connection. The kind of the conductive adhesive is not limited, and conventional conductive adhesive may be applied. For example, Ag, Ag-based alloy, C, Cu, Sn—Bi based solder or the like may be used as a conductive filler, and epoxy, silicone, phenol, urethane, acryl, polyimide or the like may be used as an adhesive binder.

Next, function of this preferred embodiment will be explained below.

In the conventional connecting lead wire for a solar battery, a thick plating of solder (for example, with a thickness of 40 μm) is provided on a surface of the conductor by fusion plating, for realizing the connection to the Si cell (solar battery cell). This plating thickness is determined by giving a great importance to a bonding strength between the solar battery cell and the connecting lead wire for a solar battery, and this is a thickness required for providing enough bonding strength. However, as a result of the solder plating, there is a disadvantage in that the 0.2% proof stress of the connecting lead wire for a solar battery is increased.

So as to solve the above problem, according to the connecting lead wire 12 for a solar battery in this preferred embodiment, a surface of the rectangular conductor 3 is coated with the plating layer 14 comprising a metallic material excellent in corrosion resistance with a thickness of not more than 5 μm, in place of the thick solder plating. According to this structure, the increase in the 0.2% proof stress of the connecting lead wire 12 for a solar battery is suppressed.

When this connecting lead wire 12 for a solar battery is connected to the Si cell by using the conductive adhesive or the like, the thermal expansion of the connecting lead wire 12 for a solar battery occurs. However, the plastic deformation is generated by a tensile stress in the thermal expansion, since the 0.2% proof stress is low, namely, the yield strength is low. Accordingly, even if the conductive adhesive is solidified, the shrinkage of the connecting lead wire 12 for a solar battery hardly occurs, so that it is possible to reduce the "cell warping force" generated by the thermal shrinkage of the conductor after the connection between the Si cell and the connecting lead wire 12 for a solar battery.

In addition, since the conductive adhesive has the thermal conductivity and the volume resistivity equal to or more than those of the solder, it is possible to connect the Si cell and the connecting lead wire 12 for a solar battery without losing the electric conductivity and the connection reliability.

The 0.2% proof stress value of the connecting lead wire 12 for a solar battery in this preferred embodiment is preferably not more than 60 MPa. By determining the 0.2% proof stress value within the above range, it is possible to reduce the cell warping and to realize a significant effect, compared with the conventional connecting lead wire (rectangular wire) for a solar battery, in which a conductor comprising a cladding material of Cu-invar-Cu or a heat-treated copper is coated with the solder plating. As described above, it is possible to realize the property evaluation in the product shape by limiting the 0.2% proof stress value of the connecting lead wire 12 for a solar battery to be not more than 60 MPa.

In addition, a plating thickness of the plating layer 14 in the connecting lead wire 12 for a solar battery in this preferred embodiment is preferably not more than 5 μm. By providing the plating layer having the thickness of not more than 5 μm, it is possible to reduce the 0.2% proof stress and to realize enough effect of suppressing the cell warping, compared with the conventional connecting lead wire for a solar battery in which the solder plating is provided. As described above, it is possible to suppress the increase in the stress by suppressing the thickness of the plating layer 14 provided on the conductor 3.

Figure 2:
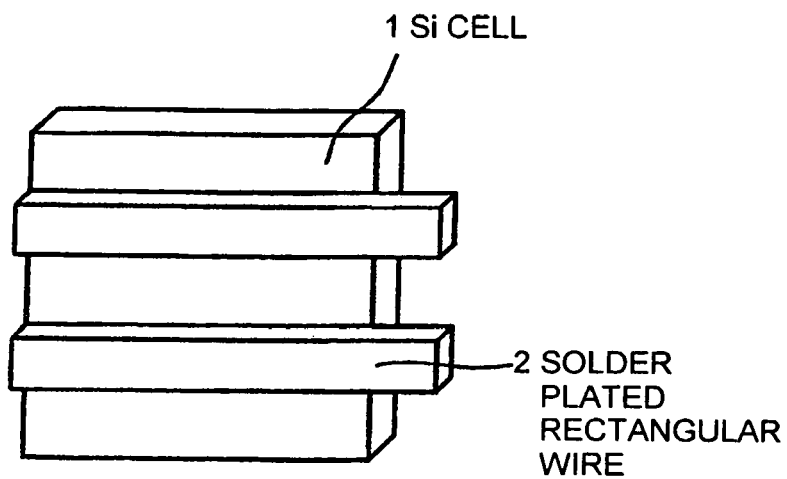
FIG. 2 is a perspective view showing a state where a connecting lead wire for a solar battery is connected to a Si cell.
Figure 3:
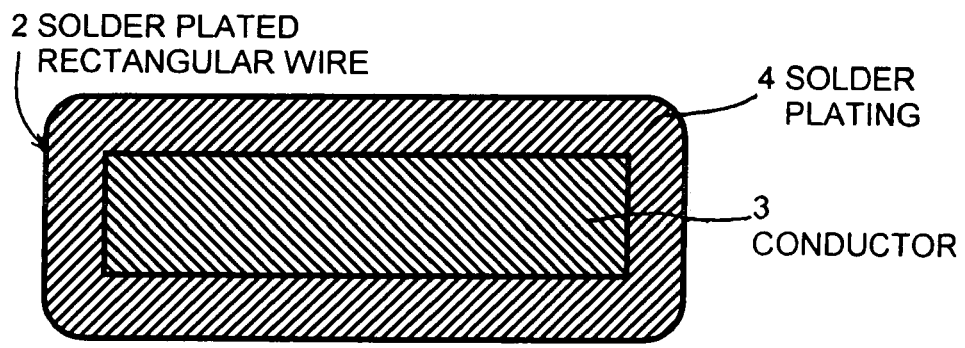
FIG. 3 is a lateral cross sectional view of a conventional and typical connecting lead wire for a solar battery.
Figure 4A:
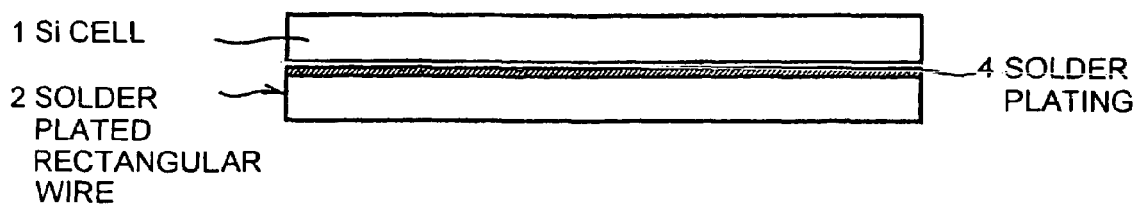
Figure 4B:
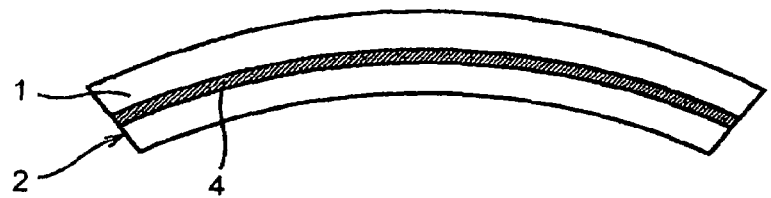
Figure 5:
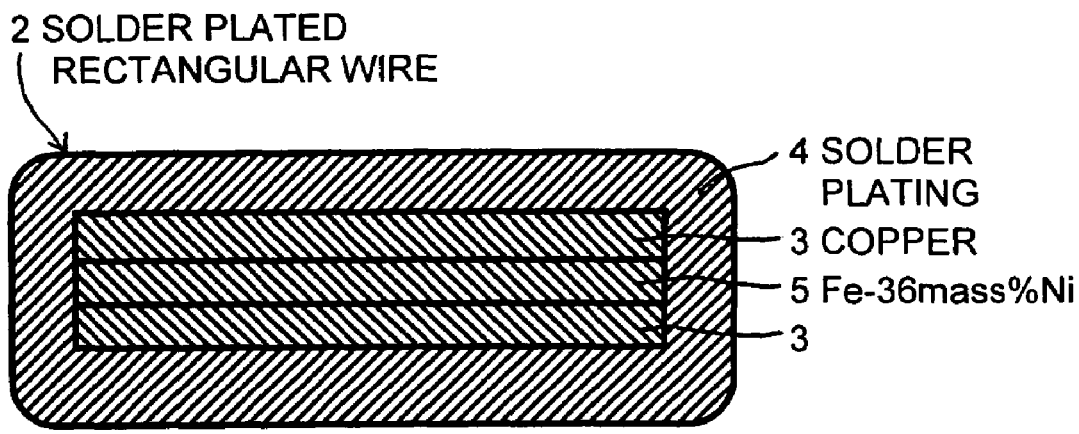
FIG. 5 is a lateral cross-sectional view of a conventional connecting lead wire for a solar battery using CIC.
Figure 6:
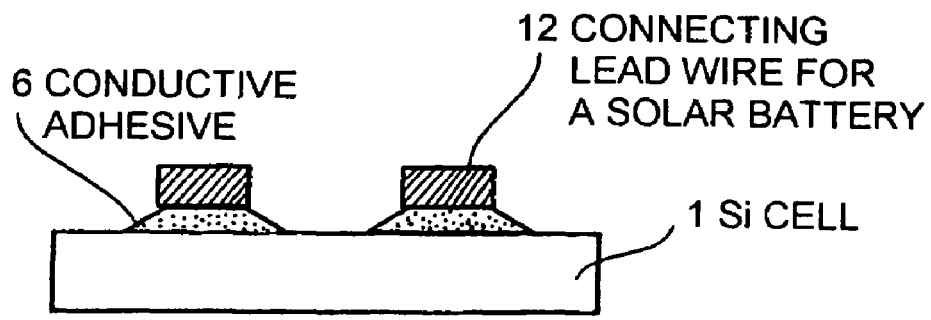
FIG. 6 is a cross sectional view showing the state where the connecting lead wire for a solar battery is connected to the Si cell.

In the connecting lead wire 12 for a solar battery shown in FIG. 1, the plating layer 14 is uniformly provided at a whole periphery of the conductor 3, however, the present invention is not limited thereto. The coating of the conductor 3 by the plating layer 14 may be provided only at a surface facing to the Si cell shown in FIGS. 2 and 6, or a part of the outer periphery of the conductor 3 (for example, un upper surface or lower surface of the conductor 3). According to this structure, it is possible to further reduce the 0.2% proof stress.

EXAMPLE

Next, an example of the connecting lead wire for a solar battery in this preferred embodiment according to the present invention will be explained below.

A Cu material was rolled to provide a rectangular wire conductor having a width of 2.0 mm and a thickness 0.16 mm, and heat treatment was conducted on the rectangular wire conductor at a temperature of 300° C. for 90 minutes. Thereafter, an outer periphery of the heat-treated conductor was coated with a thin plating of Ni to provide a connecting lead wire for a solar battery.

At this time, as shown in TABLE 3, various kinds of samples of the connecting lead wire for a solar battery with the 0.2% proof stress were prepared by changing a plating thickness of the thin plating (Examples 1 to 6 and comparative example 1).

In addition, a sample in which the plating is conducted by the solder plating (comparative example 2), a sample in which a conductor of Cu-invar-Cu (plate thickness ratio 2:1:2) is plated with the solder plating (comparative example 3), and a sample in which a conductor of a conventional copper is plated with the solder plating (comparative example 4) were also prepared.

The thin plating was conducted by the batch type processing of the galvanic electroplating (or the electroless plating), and the solder plating was conducted by the fusion plating in a "Reel-to-Reel" process (continuous system).

The 0.2% proof stress was calculated by dividing a 0.2% proof stress point load by a cross section of the conductor, in which the 0.2% proof stress point load was derived form S-S curve obtained as a result of a tensile test under a stretching speed of 20 mm/min.

In addition, a temperature cycle test (from −40° C. to 90° C.) was conducted to evaluate temperature cycle characteristics and a connection reliability was evaluated.

Further, the warping of the Si cell was examined after connecting each sample of the connecting lead wire for solar battery to a Si cell having a length of 150 mm, a width of 150 mm and a thickness of 200 μm. In the Examples 1 to 5 and the comparative example 1, the conductive adhesive was used for the connection. In the Example 6, and the comparative examples 2 to 4, the solder bonding was used for the connection. Ag/epoxy based adhesive was used as the conductive adhesive, and a curing condition was a temperature of 180° C. for 3 minutes.

TABLE 3

| Example | Conductor | Plating method | Plating thickness (μm) | 0.2% proof stress (MPa) | Cell connection | Temperature Cycle characteristics | Cell warping (mm) |
|---|---|---|---|---|---|---|---|
| Example 1 | Heat-treated copper | Thin plating | 1 | 35 | Adhesive | ○ | 0 |
| Example 2 | Heat-treated copper | Thin plating | 2 | 42 | Adhesive | ○ | 0.5 |
| Example 3 | Heat-treated copper | Thin plating | 3 | 49 | Adhesive | ○ | 1.0 |
| Example 4 | Heat-treated copper | Thin plating | 4 | 55 | Adhesive | ○ | 1.3 |
| Example 5 | Heat-treated copper | Thin plating | 5 | 60 | Adhesive | ○ | 1.5 |
| Example 6 | Heat-treated copper | Thin plating | 5 | 60 | Solder | ○ | 1.5 |
| Comparative Example 1 | Heat-treated copper | Thin plating | 6 | 66 | Adhesive | ○ | 1.8 |
| Comparative Example 2 | Heat-treated copper | Solder plating | 40 | 70 | Solder | ○ | 2.1 |
| Comparative Example 3 | Cu-invar-Cu | Solder plating | 40 | — | Solder | ○ | 3.0 |
| Comparative Example 4 | Conventional copper | Solder plating | 40 | 160 | Solder | ○ | 4.0 |

As shown in TABLE 3, it is confirmed that good temperature cycle characteristics similar to those in the solder plated products (comparative examples 2 to 4) can be obtained in the thin plated products (Examples 1 to 5 and comparative example 1) by using the conductive adhesive. Further, the good temperature cycle characteristics can be obtained in the thin plated product connected by the solder bonding (Example 6).

On the other hand, the 0.2% proof stress is increased in the solder plated products, which affects on the warping of cell. Further, even in the thin plated products, when the plating thickness is 6 μm (comparative example 1), the 0.2% proof stress and the cell warping are not greatly different from those in the solder plated product (comparative example 2).

Accordingly, it is confirmed that the plating thickness of the thin plating is preferably not more than 5 μm.

Further, in the thin plated product having a plating thickness of 5 μm (Example 5), the 0.2% proof stress is 60 MPa that is sufficiently lower than the 0.2% proof stress (160 MPa) of the comparative example 4 using the conductor of the conventional Cu, and the cell warping is reduced to be not more than 40% of the comparative example 4.

By reducing the plating thickness of the thin plated product, it is possible to further reduce the 2% proof stress as well as the warping of the cell, thereby responding to the reduction in thickness of the Si cell.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A connecting lead wire for a solar battery, to be connected to a predetermined contact region of a Si cell of the solar battery at a high temperature, the connecting lead wire comprising:

a conductor having a rectangular cross section; and
a plating layer provided on the rectangular conductor, wherein a 0.2% proof stress of an entirety of the connecting lead wire is not more than 60 MPa, and a thickness of the plating layer at a surface facing to the Si cell is not more than 5 μm.

2. The connecting lead wire for a solar battery according to claim 1, wherein:

a material of the rectangular conductor comprises a metal selected from a group consisting of Cu, Al, Ag, and Au.

3. The connecting lead wire for a solar battery according to claim 2, wherein:

the material of the rectangular conductor comprises a tough pitch copper, a low oxygen copper, an oxygen-free copper, a phosphorous deoxidized copper, or a high purity copper with a purity of not less than 99.9999%.

4. The connecting lead wire for a solar battery according to claim 1, wherein:

a volume resistivity of the rectangular conductor is not more than 50 μΩ·mm.

5. The connecting lead wire for a solar battery according to claim 2, wherein:

a volume resistivity of the rectangular conductor is not more than 50 μΩ·mm.

6. The connecting lead wire for a solar battery according to claim 3, wherein:

a volume resistivity of the rectangular conductor is not more than 50 μΩ·mm.

7. The connecting lead wire for a solar battery according to claim 1, wherein:

the plating layer comprises a metallic material including at least one element selected from a group consisting of Ni, Ag, Sn, Zn, Cr, Au, Pd, Ru, and Pt.

8. The connecting lead wire for a solar battery according to claim 7, wherein:

the metallic material further includes an accessory element of not more than 1000 ppm as a third component.

9. The connecting lead wire for a solar battery according to claim 8, wherein:

the third component comprises one of Co and P.

10. A method for fabricating a connecting lead wire for a solar battery, to be connected to a predetermined contact region of a Si cell of the solar battery at a high temperature, the method comprising:
   forming a conductor having a rectangular cross section from a metallic material;
   conducting a heat treatment on the rectangular conductor;
   providing a plating layer on the rectangular conductor to have a thickness of not more than 5 μm at a surface facing to the Si cell; and
   adjusting a 0.2% proof stress of an entirety of the connecting lead wire to be not more than 60 MPa.

11. The method for fabricating a connecting lead wire for a solar battery according to claim 10, wherein:
   the metallic material has a volume resistivity of not more than 50 μΩ·mm.

12. The method for fabricating a connecting lead wire for a solar battery according to claim 10, wherein:
   the metallic material is rolled to provide the rectangular conductor.

13. The method for fabricating a connecting lead wire for a solar battery according to claim 10, wherein:
   the slit processing is conducted on the metallic material to provide the rectangular conductor.

14. The method for fabricating a connecting lead wire for a solar battery, according to claim 10, wherein:
   the heat treatment comprises one of continuous electric heating, heat treatment using a continuous furnace, and heat treatment using a batch type heating equipment.

15. A solar battery comprising:
   a Si cell; and
   a connecting lead wire connected to a predetermined contact region of the Si cell at a high temperature, the connecting lead wire comprising:
   a conductor having a rectangular cross section; and
   a plating layer provided on the rectangular conductor,
   wherein a 0.2% proof stress of an entirety of the connecting lead wire is not more than 60 MPa, and a thickness of the plating layer at a surface facing to the Si cell is not more than 5 μm.

16. A method for fabricating a solar battery, comprising:
   preparing a Si cell having a contact region;
   preparing a connecting lead wire comprising a conductor having a rectangular cross section and a plating layer provided on the rectangular conductor, a 0.2% proof stress of an entirety of the connecting lead wire being not more than 60 MPa, and a thickness of the plating layer at a surface facing to the Si cell being not more than 5 μm;
   applying one of a conductive adhesive and a solder on a part of the connecting lead wire to be connected to the predetermined contact region of the Si cell;
   contacting the contact region of the Si cell with the part of the connecting lead wire on which the one of said conductive adhesive and the solder is applied;
   melting the conductive adhesive or the solder by heating at a high temperature; and
   solidifying the conductive adhesive or the solder to adhere and connect the contact region of the Si cell and the connecting lead wire with each other.

17. The connecting lead wire for a solar battery according to claim 1, wherein an entirety of the connecting lead wire comprises a single piece of the conductor having the rectangular cross section and the plating layer provided on the rectangular conductor.

18. The method for fabricating a connecting lead wire for a solar battery according to claim 10, wherein an entirety of the connecting lead wire comprises a single piece of the conductor having the rectangular cross section and the plating layer provided on the rectangular conductor.

19. The solar battery according to claim 15, wherein an entirety of the connecting lead wire comprises a single piece of the conductor having the rectangular cross section and the plating layer provided on the rectangular conductor.

20. The method for fabricating a solar battery according to claim 16, wherein an entirety of the connecting lead wire comprises a single piece of the conductor having the rectangular cross section and the plating layer provided on the rectangular conductor.

* * * * *